US005638007A

United States Patent [19]
Sabin

[11] Patent Number: 5,638,007
[45] Date of Patent: Jun. 10, 1997

[54] METHOD AND APPARATUS FOR LIMITING THE SLEW RATE OF OUTPUT DRIVERS OF AN INTEGRATED CIRCUIT BY USING PROGRAMMABLE FLASH CELLS

[75] Inventor: Gregory D. Sabin, Phoenix, Ariz.

[73] Assignee: Intel Corporation, Santa Clara, Calif.

[21] Appl. No.: 534,256

[22] Filed: Sep. 26, 1995

[51] Int. Cl.⁶ ............................................. H03K 19/0948
[52] U.S. Cl. .............................. 326/27; 326/87; 327/170
[58] Field of Search .......................... 326/27, 83, 86–87, 326/121, 17; 327/170

[56] References Cited

U.S. PATENT DOCUMENTS

| | | | |
|---|---|---|---|
| 4,959,564 | 9/1990 | Steele | 326/44 |
| 5,039,874 | 8/1991 | Anderson | 327/170 |
| 5,194,765 | 3/1993 | Dunlop et al. | 326/87 |
| 5,387,824 | 2/1995 | Michelsen | 326/83 |
| 5,489,858 | 2/1996 | Pierce et al. | 326/83 |

Primary Examiner—Edward P. Westin
Assistant Examiner—Jon Santamauro
Attorney, Agent, or Firm—Blakely, Sokoloff, Taylor & Zafman

[57] ABSTRACT

The output driver includes a plurality of transistor devices connected to an output line. A separate flash-programmable element is connected to each of the plurality of transistor devices. Each of the separate flash elements receives the data signal along an input line and outputs the data signal if the flash cell is enabled (or not programmed) and outputs a constant voltage level, regardless of the data signal, if the flash element is not enabled. Hence, only those output transistors connected to flash elements that have been enabled are triggered by the output signal. Other transistors merely receive a constant voltage and are, therefore, not triggered regardless of the output signal. By enabling only a few of the transistors, a current slew rate of current drawn through the transistors is reduced, thereby reducing overall voltage noise levels, although at the expense of slower signal throughput. By enabling all or most transistors, the current slew rate is increased, thereby resulting in greater voltage noise, but also achieving faster signal throughput. The various flash-programmable elements of the output drivers of the integrated circuit chip are programmed after fabrication of the chip based upon the voltage noise constraints of the specific environment of the chip, including the clock rate, form factor, packaging and type of peripheral devices.

14 Claims, 3 Drawing Sheets

5,638,007

METHOD AND APPARATUS FOR LIMITING THE SLEW RATE OF OUTPUT DRIVERS OF AN INTEGRATED CIRCUIT BY USING PROGRAMMABLE FLASH CELLS

BACKGROUND OF THE INVENTION

1. Field of the Invention

The invention generally relates to integrated circuits (ICs) and in particular to techniques for limiting the current slew rate of output drivers of an IC.

2. Description of Related Art

Typical ICs include a set of output drivers for driving signals provided by internal circuitry of the IC through output pads onto output transmission lines, which may be individual lines of an output bus. A typical output driver includes one or more transistors connected to a high voltage power supply and ground. Gates of the transistors are connected to internal lines providing the signals to be output. Often, the output transistors are connected in "complementary" pairs, with each pair having a PMOS transistor and NMOS transistor. An output of the driver appears on interconnected drains of the NMOS and PMOS transistors.

In use, a signal to be output is simultaneously applied to the gates of each of the PMOS transistors and each of the NMOS transistors. Outputs from the transistors are combined onto the single output line. To provide sufficient power for pulling up or pulling down the output line, which may be subject to a large external load, the output driver is typically provided with fairly large transistors connected to a power supply providing a significant amount of charge. Accordingly, when the input signal is applied to the gates of transistors, a significant current is quickly conducted through the transistors. Noise in the output signal, however, is directly proportional to the time rate of change of current herein also referred to as the current "slew" rate. Accordingly, the faster the current increases from near 0 to an amount required for driving the output signal, the greater the noise in the output signal. Even greater noise occurs when the output signal is driven from high to low voltage. In this context, "noise" represents any deviation in the intended voltage of the output signal. If the deviation is significant, it may be difficult or impossible for an external device connected to the output line to properly receive the intended signal.

FIG. 1 illustrates the time rate of change of current drawn through the output transistors of such a conventional output driver. As can be seen, the current increases steeply than decreases steeply, resulting in a current spike 10, causing significant noise.

FIG. 2 illustrates a transition in an intended output signal 12 and an actual signal 14, subject to significant voltage noise. As can be seen, the output voltage varies or oscillates significantly, before being dampened. Large voltage swings, such as identified by reference 16, may be erroneously detected as a further transition in the output signal.

In practical systems, noise of the type illustrated in FIG. 2 occurs only if a large number of high-drive output drivers are triggered simultaneously causing a significant change in the total power supply current with respect to time. Accordingly, to avoid noise problems, many systems are merely configured to trigger only a certain maximum number of output drivers simultaneously, to thereby lower the overall time rate of change of current drawn from the power source and to thereby limit the amount of noise. For state of the art integrated circuits, however, it is frequently necessary to trigger a large number of output drivers simultaneously for use in, for example, driving a 32-bit bus at a high clock rate. Accordingly, techniques have been developed for reducing the current slew rate within at least some of the output drivers to allow a large number of the drivers to be triggered simultaneously while generating an acceptable amount of voltage noise.

FIG. 3 illustrates the PMOS components of a conventional output driver configured to reduce the current slew rate. Output driver 20 includes a set of three separate output transistors 22, 24 and 26 interconnected to a set of three staggered inverters 28, 30 and 32. An input line 34 is connected into inputs of each of the inverters. An output of inverter 28 enables inverter 30. Likewise, an output of inverter 30 enables inverter 32. Accordingly, the three inverters output three versions of the input signal (inverted) with each being delayed or advanced with respect to the others.

The outputs of the three inverters are connected to the gates of transistors 22 through 26, respectively, such that three transistors are triggered at slightly different times. More specifically, transistor 26 is triggered first, then transistor 24, and finally transistor 22. By triggering the output transistors at slightly different times, the total time rate of change of current caused by activation of the output transistors is decreased, thus yielding lower voltage noise.

Although not shown, output driver 20 also includes a set of NMOS transistors and a set of corresponding staggered inverters, interconnected as a mirror image of the components shown in FIG. 2. Also, although not separately shown, each of transistors 22, 24 and 26 may represent an entire set of transistors. In other words, a set of, for example, four or five output transistors may be connected to the outputs of each of the inverters. Such may be required if the individual transistors are fairly small in size. In a practical system, only some of the output drivers are configured as shown in FIG. 2. Other output drivers, particularly those transmitting critical signals, are configured conventionally. Such allows the critical signals to be transmitted promptly, while only the less critical signals are delayed somewhat by transmission through a set of staggered inverters.

The configuration of FIG. 2 succeeds in reducing the current slew rate caused by signals transmitted therethrough. However, one disadvantage of the arrangement of FIG. 3, is that the slew rate, once set, cannot be modified. In other words, during design of an IC incorporating the output driver of FIG. 3, the sizes and characteristics of the inverters and transistors must be determined. Often, however, it is not known during the design stage what the slew rate should be set to. For example, the speed of operation of components within integrated circuit are highly dependent upon temperature. Accordingly, if an IC is to be used in a low temperature environment, the output drivers will switch faster, resulting in higher noise. However, during the design stage, it may not be known whether the IC is to be used in a low temperature environment or not. Also, it is often not known what peripheral components the IC will be used in connection with. The peripheral components may affect the external load applied to the output buffers, and thereby affect the amount of voltage noise occurring for a given current slew rate. Also, ICs fabricated in accordance with a single design may be operated at different clock rates. For those with slow clock rates, less 20 voltage noise is generated than ICs employed with higher clock rates. The amount of voltage noise may also depend upon the packaging of the IC or upon its form factor.

Because the environment, clock rate, packaging or form factor of an IC may not be known in advance, a system designer must "guess" or otherwise predict what amount of current slew rate reduction is required and design the IC accordingly. The designer must also allow for a sufficient noise margin in the event that the current slew rate reduction is not sufficient. Such can result in an overall IC configured to perform at a clock rate less than would otherwise be desired.

Accordingly, it would be desirable to provide a method and apparatus for controlling current slew rate within an output driver wherein the current slew rate can be set or modified subsequent to wafer fabrication, and perhaps subsequent to packaging of the wafer in an IC and it is to that end that the aspects of the present invention are drawn.

SUMMARY OF THE INVENTION

In accordance with the invention, a programmable means for selecting the current slew rate for output signals driven by an output driver of an integrated circuit chip is provided. In one embodiment, wherein the output driver includes a plurality of transistor devices connected to an output line, the programmable means comprises a separate flash-programmable element connected to each of the plurality of transistor devices. Each of the separate flash elements receives a data signal along an input line and outputs the data signal if the flash element is enabled or programmed and outputs a constant voltage level, regardless of input data, if the flash element is not enabled. Hence, only those output transistors connected to flash-elements that have been enabled are triggered by the output signal. Other transistors merely receive a constant voltage and are therefore not triggered regardless of the output signal. Thus, by selectively programming or enabling the flash elements, a portion of the output transistors are disabled, thereby causing current to flow only through the remaining transistors.

By enabling fewer transistors, the overall current slew rate for the output driver is thereby lowered or reduced resulting in lower voltage noise. By enabling more transistors, the faster the current slew rate and the greater the resulting noise. Also, by enabling more output transistors, the output signal is transmitted to the output line faster. By enabling fewer output transistors, the output signal is transmitted to the output line slower. Hence, a trade-off occurs between voltage noise and output signal propagation rates.

After the integrated circuit having the flash-programmable output drivers is fabricated, selected flash elements are enabled within selected output drivers to reduce the overall current slew rate by an amount sufficient to reduce the overall voltage noise level to an acceptable amount depending on the specific environment in which the chip is to be used. Thus, if the chip is intended to be used in a low temperature environment, the flash elements may be programmed to disable a greater number of transistors, thereby slowing the overall current slew rate, to compensate for increased transmission rates resulting from the low temperatures. As another example, the flash elements may be programmed, depending upon the specific package into which the IC is mounted, to maximize signal transmission output rates while maintaining an acceptable voltage noise level. Hence, the selection of a number of output transistors to be used within each output driver may be deferred until the environment of the integrated circuit is known. At that time, selected output transistors are enabled or disabled to achieve maximum propagation rates of output signals while maintaining an acceptable voltage noise level. Other aspects of the invention will be apparent from the drawings attached hereto and for the detailed description which follows.

DETAILED DESCRIPTION OF EXEMPLARY EMBODIMENTS OF THE INVENTION

Referring to FIGS. 4–7, exemplary embodiments of the invention will now be described. The exemplary embodiments will primarily be described with reference to block diagrams and circuit schematics illustrating important components of the invention. A practical system may require additional components not described or illustrated herein. The additional components are not described or illustrated because those components are not necessary for an understanding of the principles of the invention. Moreover, the internal configuration or fabrication of the various components described herein will not typically be set forth, as such components can be configured and fabricated in accordance with conventional techniques or in accordance with the teachings provided herein.

Figure 1:
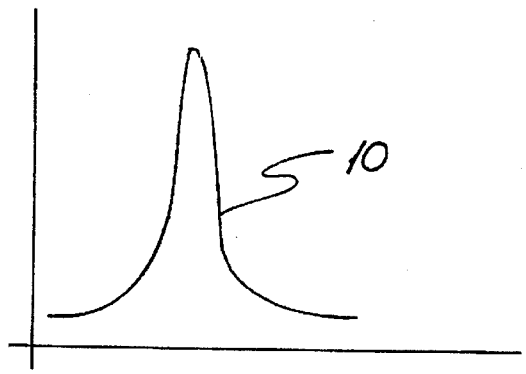
FIG. 1 is a graph illustrating the time rate of change of current drawn through the output transistors of the conventional output driver.
Figure 2:
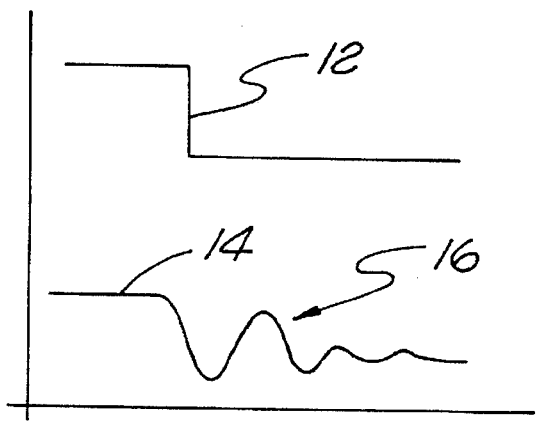
FIG. 2 is a graph illustrating an intended output signal and an actual output signal subject to significant voltage noise.
Figure 3:
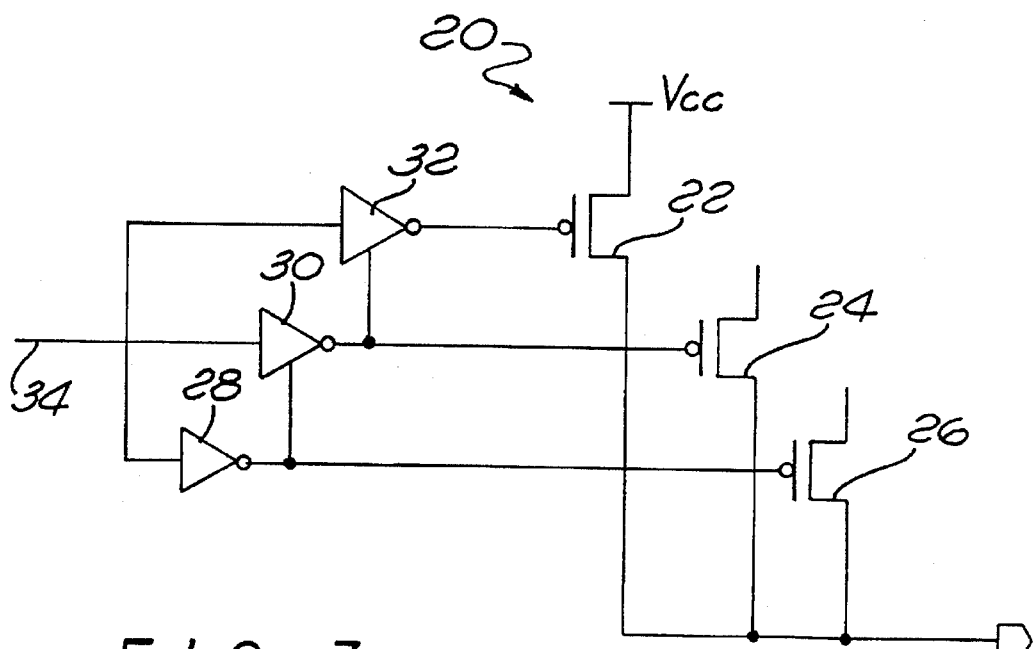
FIG. 3 is a schematic illustration of a conventional output driver configured with staggered inverters for reducing the current slew rate.
Figure 4:
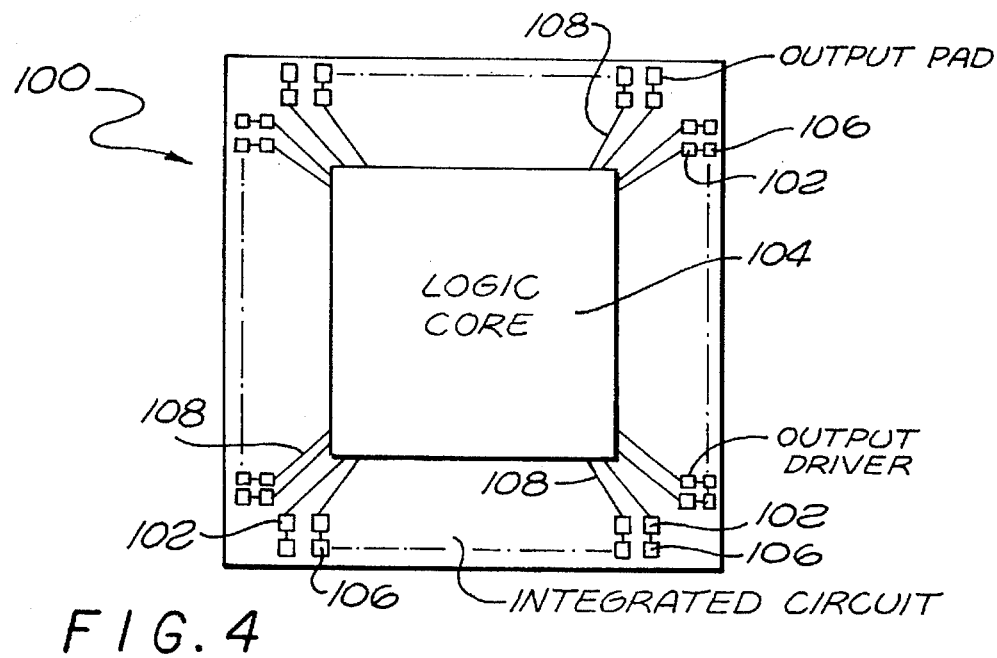
FIG. 4 is block diagram illustrating an integrated circuit having output drivers configured in accordance with principles of the invention.

FIG. 4 illustrates an integrated circuit 100 having a set of output drivers 102 interconnecting a core logic unit 104 and a set of output pads 106. Each output driver 102 is connected along a separate output line 108 connecting the core logic unit to the respective output pad. Although not separately shown in FIG. 4, integrated circuit 100 may be mounted within a package or other suitable module and interconnected to external components either directly or through a bus. Integrated circuit 100 may form part of a computer system or other system incorporating integrated circuits.

Figure 5:
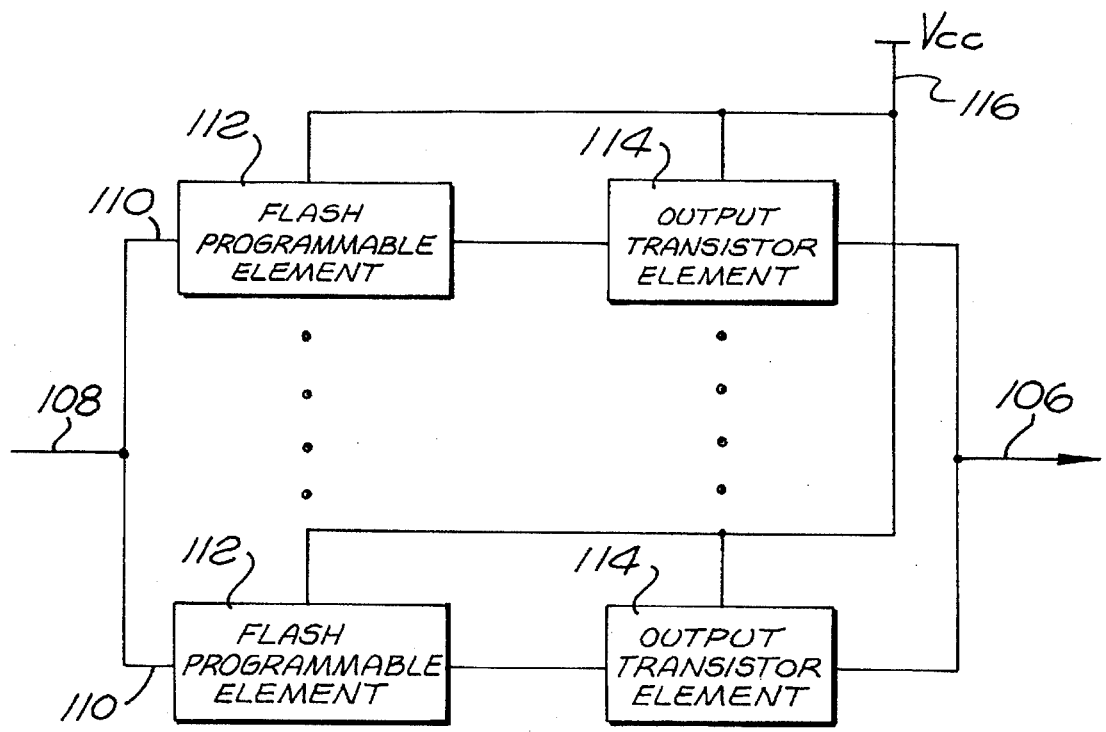
FIG. 5 is block diagram illustrating one of the output drivers of the integrated circuit of FIG. 4.

FIG. 5 illustrates one of the output drivers of FIG. 4. The output driver receives signals to be output along line 108 which is split into a set of N individual lines 110. A flash-programmable element 112 and an output transistor driver element 114 are connected along each individual line 110. Each transistor driver element 114 is connected to a high voltage power source 116. The flash-programmable element is also connected to the high voltage power source.

Each flash-programmable element 112 effectively operates as a switch which passes the output signal to the corresponding transistor driver element 114, if enabled or programmed, or does not transmit the signal, otherwise. Each output transistor element 114 operates to draw current from power supply 116 to output a signal to pad 106 if a signal is received from the corresponding flash-programmable element 112 and draws no current, otherwise. The output signal ultimately transmitted to pad 106 is the combined output signals from each of the output transistor elements 114 receiving output signals from corresponding flash-programmable elements 112.

In use, a selected number of flash-programmable elements 112 are programmed or enabled to allow the output signal to pass therethrough. The flash-programmable elements may be programmed by conventional means such as by hot electron injection. Thereafter, an output signal received along line 108 is transmitted only through those flash-programmable elements that are enabled. Accordingly, only corresponding output drivers receive and drive the output signal to pad 106 by drawing current from power source 116. If all or most programmable elements 112 are enabled, then all or most of the output drivers operate, substantially simultaneously, to draw current from power source 116 and to drive the output signal to pad 106. As a result, a significant time rate of change in current drawn from the power supply occurs, and the resulting output signal may be subject to significant voltage noise. Other output signals transmitted simultaneously through other output drivers may also be subject to the significant amount of voltage noise. However, because all or most output transistor elements of driver 102 are operating in parallel, a minimum sufficient of current is quickly drawn from power supply 116, allowing the output signal to be quickly driven to pad 106. Hence, fast throughput is achieved, although at the expense of increased voltage noise. If only one or a few of the flash-programmable elements 112 are enabled, then the output signal is received by only a few of the output transistor elements. Because only one or a few of the transistor elements operate, it takes longer for the minimum sufficient amount of charge to be drawn from current supply 116 to drive the output signal to pad 106. As such, the time rate of change of current drawn from the power supply is comparatively slow and the voltage noise level is thereby reduced. However, because only one or a few of the output transistor drivers are operating simultaneously, the output signal is driven to pad 116 more slowly, resulting in generally slower signal transmission throughput.

As noted, integrated circuit 100 of FIG. 4 includes one output driver for each output line. Each of the output drivers may be configured as illustrated in FIG. 5 or some may be otherwise conventional output drivers. For each output driver configured with flash-programmable elements, either one, some or all of the elements may be enabled to select the transmission rate/voltage noise contribution level for that output driver. For example, the output drivers connected to critical signal pads may be flash-programmed to achieve maximum transmission rates, while contributing significant voltage noise. Output drivers connected to non-critical signal pads may be flash-programmed to provide slower transmission rates while contributing less voltage noise. In this manner, the voltage noise contributed by critical signal paths is offset by noise reduction achieved for non-critical signal paths.

Flash-programming of the individual output drivers is performed subsequent to fabrication of the integrated circuit incorporating the output drivers, and perhaps subsequent to product test. (It is, however, also possible to set the programming state of the flash cells during fabrication.) In practical implementations, actual programming of the flash elements is deferred until the environment into which the wafer is to be placed has been determined. The environment includes the particular packaging into which the wafer is mounted, and the peripheral components connected to the wafer, such as the specific bus interconnection system. The environment also includes the clock rate and form factor of the IC. Each of these factors, as well as other factors, may affect the amount of voltage noise generated by each output driver and may affect the total amount of acceptable voltage noise. Once the environment is determined, the flash-programmable elements of the various output drivers are selectively programmed to achieve desired performance characteristics, such as maximum output rates, while remaining within maximum permissible voltage noise levels.

Figure 6:
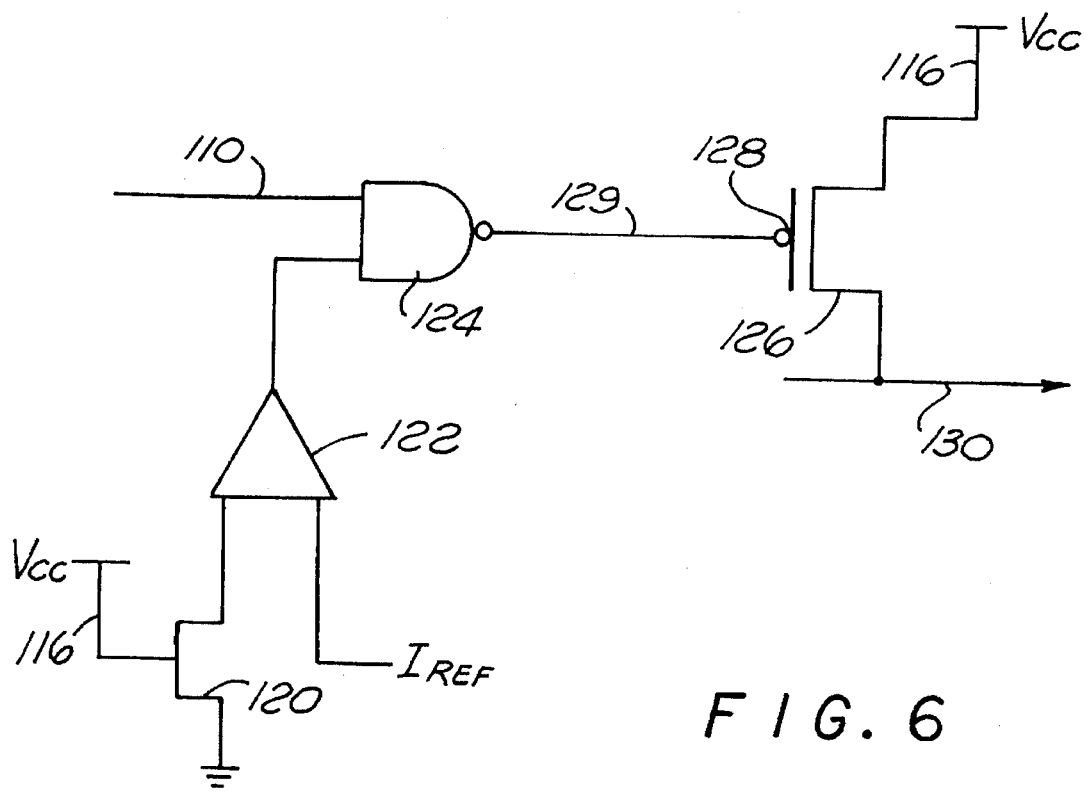
FIG. 6 is a schematic illustration of a flash-programmable element of the output driver of FIG. 5 and a corresponding output transistors.

FIG. 6 illustrates an exemplary implementation of one of the programmable elements of FIG. 5. Programmable element 112 of FIG. 6 includes a flash cell 120, a 2-input sense amplifier 122 and a 2-input NAND gate 124. A gate of flash cell 120 is connected to the high voltage power supply 116 under normal or non-programming operation. (The gate is alternatively connected to a very high voltage to program the flash cell.) A source of the flash cell is connected as one of the inputs of sense amplifier 122 and a drain of the flash cell is connected to ground. The second input of sense amplifier 122 receives a current reference signal $I_{ref}$. In other implementations, a voltage reference signal may alternatively be employed. A NAND gate 124 receives the input signal along line 110 and an output of sense amplifier 122. The output of NAND gate 124 is connected into a corresponding PMOS transistor 126 of output transistor element 114 (FIG. 5).

With this configuration, NAND gate 124 outputs the input signal received along line 120, inverted, if flash cell 120 is enabled or programmed, and outputs a constant high voltage signal otherwise. More specifically, if the flash cell 120 is enabled, the flash cell does not allow current to flow. Hence, sense amplifier 122 detects different currents on its two inputs, and therefore outputs a low voltage signal to NAND gate 124. Hence, NAND gate 124 outputs a high voltage signal, regardless of the input along line 110. If the flash cell 120 is enabled, then the flash cell operates as a (NMOS) transistor allowing current to flow. Hence, sense amplifier 122 detects equal currents on both inputs, and outputs a high voltage signal to the NAND gate. The NAND gate, then outputs a low voltage signal if the input along line 110 is high and a high voltage signal otherwise. In other words, NAND gate 124 outputs the input signal inverted.

As noted, FIG. 6 also illustrates an output PMOS transistor 126 corresponding to a portion of the corresponding output transistor element 114 (FIG. 5). The output of NAND gate 124 is applied to a gate 128 of PMOS transistor 126 via line 129. A source of the PMOS transistor is connected to the high voltage power source 116 (FIG. 5). The drain of the PMOS transistor is connected to an output line 130 connected to output pad 106 (also FIG. 5). Hence, if flash cell 120 is not enabled or programmed, gate 128 receives a constant high voltage signal, and hence does not draw any current from the high voltage power source. If flash cell 120 is enabled or programmed, then gate 128 receives the output signal inverted and pulls down the output line 130 whenever the output signal is low. Hence, current is drawn from the high voltage current supply.

Although not separately shown in FIG. 6, output transistor element 14 includes an NMOS transistor connected in series with PMOS transistor 26. Likewise, flash-programmable element 112 includes a second set of components, including a second flash cell, sense amplifier and AND gate, interconnected to the gate of the NMOS transistor. In other words, a mirror image of the PMOS transistor/flash cell configuration is provided with AND instead of NAND. With this arrangement, the NMOS transistor receives a constant low voltage signal if the corresponding flash cell is enabled, and the inverted output signal, otherwise. As such, the NMOS transistor is not enabled and does not draw any current if the corresponding flash cell is disabled. If the corresponding flash cell is not enabled, then the NMOS transistor pulls down the voltage on output line 130 upon receiving a high voltage signal from the corresponding AND gate.

Hence, the PMOS and NMOS transistors pull up or pull down (respectively) the voltage on output line 130 in accordance with the output signal, but only if the flash cells of the corresponding flash-programmable element are enabled. The net result of the operation of the pair of PMOS and NMOS transistors is to re-invert the output signal.

Figure 7:
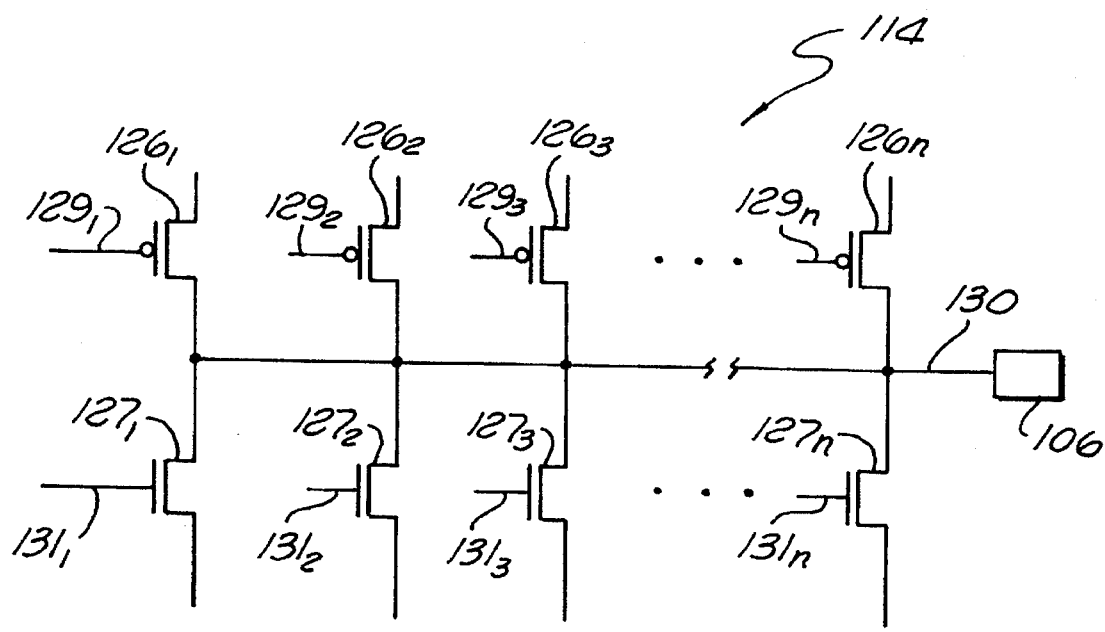
FIG. 7 is circuit schematic illustrating a set of output transistor elements for use with the output driver of FIG. 5.

FIG. 7 illustrates the PMOS and NMOS transistors for each of an entire set of output transistor elements 114, each interconnected to the single output line 130 connected to output pad 106. PMOS transistor elements are identified by reference 126 with subscripts, i.e., $126_1, 126_2 \ldots 126_N$. Each individual PMOS transistor is connected through a separate connection line 129, with corresponding subscript, to a corresponding flash cell (FIG. 6). NMOS transistor elements are represented by reference 127, with appropriate subscripts, and each is connected through a separate interconnection line 131, also subscripted, to a corresponding flash cell. Hence, N pairs of output transistors are provided, each connected to a corresponding pair of flash cells. With this configuration, the output signal transmitted to pad 106 represents the sum of the output signals driven by each of the pairs of PMOS and NMOS transistors. As noted, depending upon the flash-programming of the corresponding programmable elements, only a subset of the total number of PMOS and NMOS transistors may receive the output signal. At minimum, at least one such pair of PMOS and NMOS transistors must receive the output signal, to thereby allow the output signal to be transmitted to pad 106. At most, all N pairs receive output signals. Although a wide range of different sizes may be employed for actually configuring the transistors of FIG. 7, in one implementation each transistor is 30/1.2 transistor.

What has been described thus far is an output driver employing a flash-programmable elements for use in setting or selecting the overall current slew rate to thereby set or select the amount of voltage noise. In other embodiments, other techniques may be employed for implementing the programmable element. For example, electrically erasable and programmable read only memory (EEPROM) or EPROM elements may be employed. Indeed, in general, any technique for permanently or semi-permanently programming the programmable elements may be employed. In still other embodiments, the programmable elements may be interconnected to logic elements which allow the slew rate to be controlled during the operation of the integrated circuit, perhaps under the control of programs running within the core of the integrated circuit. As can be appreciated, a wide range of alternative embodiments may be employed. In general, the embodiments described herein are merely illustrative of principles of the invention and should not be construed as limiting the scope of the invention.

What is claimed is:

1. In an output driver including a plurality of transistor devices connected to an output line for outputting signals, subject to a current change slew rate, from an integrated circuit chip, an improvement comprising:

a programmable means for selecting the slew rate for output signals driven by the output driver, wherein said programmable means comprises:

a separate flash-programmable device connected to each of the plurality of transistor devices, each of said separate flash-programmable devices receiving a data signal along an input data line and outputting the data signal if the flash-programmable device is enabled and outputting a constant voltage level signal, regardless of input data, if the flash-programmable device is not enabled.

2. The improvement of claim 1 wherein each flash-programmable device comprises:

a flash cell transistor having a gate connected to a high voltage level and a drain connected to ground during an output mode;

a sense amplifier having a first input connected to a source of the flash cell and a second input connected to a current reference signal; and a logic circuit having a first input connected to said input data line and a second input connected to an output of said sense amplifier.

3. An output driver having a programmable slew rate for use on an integrated circuit, said output driver comprising:

a data line for providing data to be output from the integrated circuit;

a plurality of output driver transistor devices each having an output connected to a common output pad; and a plurality of flash-programmable devices, with each flash-programmable device connected between the data line and an input of a respective one of the output transistor devices, with each said flash-programmable device outputting a data signal provided by the data line if enabled and outputting a constant value if non-enabled such that only a selected portion of the output transistor devices receive the data signal to be transmitted, said selected portion being determined by the enabling of a corresponding selected portion of the flash-programmable devices.

4. The output driver of claim 3 wherein each flash-programmable device comprises:

a flash cell transistor having a gate connected to a high voltage level and a drain connected to ground during output mode;

a sense amplifier having a first input connected to a source of the flash cell and a second input connected to a current reference signal; and a logic circuit having a first input connected to said input data line and a second input connected to an output of said sense amplifier.

5. The output driver of claim 3 wherein each output transistor device includes a transistor having a gate connected to an output of the respective flash-programmable device.

6. The output driver of claim 3 wherein each output transistor element includes a PMOS transistor and an NMOS transistor, connected in series between a high voltage source and a ground, and having respective drain outputs connected to the common output pad; and wherein each respective flash-programmable device includes a first flash-programmable element connected between the input data line and a gate of the PMOS transistor element and a second flash-programmable element connected between the input data line and a gate of the NMOS transistor device.

7. The output driver of claim 6 wherein each of the first and second flash-programmable elements comprises:

a flash cell transistor having a gate connected to a high voltage level and a drain connected to ground;

a sense amplifier having a first input connected to a source of the flash cell and a second input connected to a current reference signal; and a logic circuit having a first input connected to said input data line and a second input connected to an output of said sense amplifier.

8. An integrated circuit comprising:

core logic circuitry;

a plurality of output pads; and a plurality of output drivers connected between the core logic circuitry and respective output pads, each of said output drivers including a data line for receiving data from the core logic circuitry to be output from the integrated circuit;

a plurality of output driver transistor devices each having an output connected to respective output pad; and a plurality of flash-programmable devices, with each said flash-programmable device connected between the data line and an input of a respective one of the output transistor devices, with each said flash-programmable device outputting a data signal provided by the data line if enabled and outputting a constant value if non-enabled such that only a selected portion of the output transistor devices receive the data signal to be transmitted, said selected portion being determined by the enabling of a corresponding selected portion of the flash-programmable devices.

9. The integrated circuit of claim 8 wherein each flash-programmable [element]device comprises:

a flash cell transistor having a gate connected to a high voltage level and a drain connected to ground during output mode;

a sense amplifier having a first input connected to a source of the flash cell and a second input connected to a current reference signal; and a logic circuit having a first input connected to said input data line and a second input connected to an output of said sense amplifier.

10. The integrated circuit of claim 8 wherein each output transistor device includes a transistor having a gate connected to an output of the respective flash programmable device.

11. The integrated circuit of claim 8 wherein each output transistor element includes a PMOS transistor and an NMOS transistor, connected in series between a high voltage and a ground, and having respective outputs connected to the common output pad; and wherein each respective flash-programmable device includes a first flash-programmable element connected between the input data line and a gate of the PMOS transistor element and a second flash-programmable element connected between the input data line and a gate of the NMOS transistor device.

12. The integrated circuit of claim 11 wherein each of the first and second flash-programmable elements comprises:

a flash cell transistor having a gate connected to a high voltage level and a drain connected to ground;

a sense amplifier having a first input connected to a source of the flash cell and a second input connected to a current reference signal; and a logic circuit having a first input connected to said input data line and a second input connected to an output of said sense amplifier.

13. An output driver for use on an integrated circuit, said output driver comprising: means for receiving data to be output from the integrated circuit;

means for driving the data onto an output line subject to a current change slew rate, wherein said means for driving includes a plurality of output driver transistor devices each having an output connected to a common output pad; and means for setting the slew rate subsequent to fabrication of the integrated circuit Wherein said means for setting includes a plurality of flash-programmable devices, with each flash-programmable device connected between the means for receiving data and an input of a respective one of the output transistor devices, with each said flash-programmable device outputting a data signal provided by the means for receiving data if enabled and outputting a constant value if non-enabled such that only a selected portion of the output transistor devices receive the data signal to be transmitted, said selected portion being determined by the enabling of a corresponding selected portion of the flash-programmable devices.

14. A method for selecting the slew rate of an output driver for use on an integrated circuit, said method comprising the steps of:

fabricating an integrated circuit having output drivers connected to flash programmable devices, with said flash programmable devices controlling the number of output transistors enabled within each output driver;

determining the permissible voltage noise level for the integrated circuit; and programming a selected portion of the flash programmable devices to enable a corresponding selected portion of the output transistors of the output drivers to maintain said voltage noise level within said permissible voltage noise level.

* * * * *

UNITED STATES PATENT AND TRADEMARK OFFICE
CERTIFICATE OF CORRECTION

PATENT NO.    : 5,638,007
DATED         : June 10, 1997
INVENTOR(S)   : Gregory D. Sabin It is certified that error appears in the above-identified patent and that said Letters Patent is hereby corrected as shown below:

In column 2 at line 2 delete "dock" and insert --clock--

In column 2 at line 62 delete "less 20 voltage noise" and insert --less voltage noise--

In column 6 at line 56 delete "14" and insert --114--

In column 6 at line 57 delete "26." and insert --126.--

Signed and Sealed this

Ninth Day of June, 1998

Attest:

BRUCE LEHMAN

Attesting Officer

Commissioner of Patents and Trademarks